US011539085B2

(12) United States Patent
Ing et al.

(10) Patent No.: US 11,539,085 B2
(45) Date of Patent: Dec. 27, 2022

(54) SERVICEABLE FLEX CIRCUIT FOR BATTERY MODULE

(71) Applicant: NIO Technology (Anhui) Co., Ltd., Anhui (CN)

(72) Inventors: Adam H. Ing, San Francisco, CA (US); Yadunandana Yellambalase, Mountain View, CA (US)

(73) Assignee: NIO Technology (Anhui) Co., Ltd., Hefei (CN)

( * ) Notice: Subject to any disclaimer, the term of this patent is extended or adjusted under 35 U.S.C. 154(b) by 220 days.

(21) Appl. No.: 16/800,964

(22) Filed: Feb. 25, 2020

(65) Prior Publication Data

US 2021/0265669 A1 Aug. 26, 2021

(51) Int. Cl.
*H01M 10/42* (2006.01)
*H01M 50/502* (2021.01)
*H05K 1/11* (2006.01)
*H01M 50/519* (2021.01)
*H01M 50/583* (2021.01)

(52) U.S. Cl.
CPC ....... *H01M 10/425* (2013.01); *H01M 50/502* (2021.01); *H05K 1/118* (2013.01); *H01M 50/519* (2021.01); *H01M 50/583* (2021.01)

(58) Field of Classification Search
None
See application file for complete search history.

(56) References Cited

U.S. PATENT DOCUMENTS

| 4,845,419 A | * | 7/1989 | Hacker | H02J 7/0071 |
| | | | | 320/136 |
| 10,244,621 B2 | | 3/2019 | Swoish | |
| 2010/0216010 A1 | | 8/2010 | Straubel et al. | |
| 2013/0288530 A1 | * | 10/2013 | Zhao | H01R 13/73 |
| | | | | 439/627 |
| 2015/0180094 A1 | * | 6/2015 | Rieg | H01M 10/488 |
| | | | | 219/121.72 |
| 2018/0180017 A1 | | 6/2018 | Vogelbacher | |
| 2021/0359368 A1 | * | 11/2021 | George | H01M 50/528 |

FOREIGN PATENT DOCUMENTS

DE 102018006691 2/2019

* cited by examiner

*Primary Examiner* — Carmen V Lyles-Irving
(74) *Attorney, Agent, or Firm* — Sheridan Ross P.C.

(57) ABSTRACT

A battery connector, including a flexible circuit including a first set of electrical circuitry connecting to a plurality of energy storage cells, where the first set of electrical circuitry terminates at a first connection point at the battery connector; a controller including components to control the energy storage cells connected to a second set of electrical circuitry terminating at a second connection point at the battery connector; where the first connection point and the second connection point are electrically connected.

16 Claims, 6 Drawing Sheets

SERVICEABLE FLEX CIRCUIT FOR BATTERY MODULE

FIELD

The present disclosure is generally directed to battery module connections, in particular, toward battery module connections including electrical circuit connectors.

BACKGROUND

In recent years, transportation methods have changed substantially. This change is due in part to a concern over the limited availability of natural resources, a proliferation in personal technology, and a societal shift to adopt more environmentally friendly transportation solutions. These considerations have encouraged the development of a number of new flexible-fuel vehicles, hybrid-electric vehicles, and electric vehicles.

Vehicles employing at least one electric motor and power system store electrical energy in a number of battery cells. These battery cells are typically connected to an electrical control system to provide a desired available voltage, ampere-hour, and/or other electrical characteristics. In some cases, the battery cells may be connected to a battery management system configured to monitor the voltage sensed from each cell in a battery module and/or a battery pack.

The battery cells may include a number of internal or external protective devices such as pressure, temperature, current (PTC) switches, current interrupt devices (CID), vents, fuses, and/or protection circuit boards. Many of these devices are intended to prevent over-temperature, high pressure, current surges, and/or over-charges. However, the systems are prone to failure and tend to be unreliable in certain environmental conditions.

DETAILED DESCRIPTION

Figure 1:
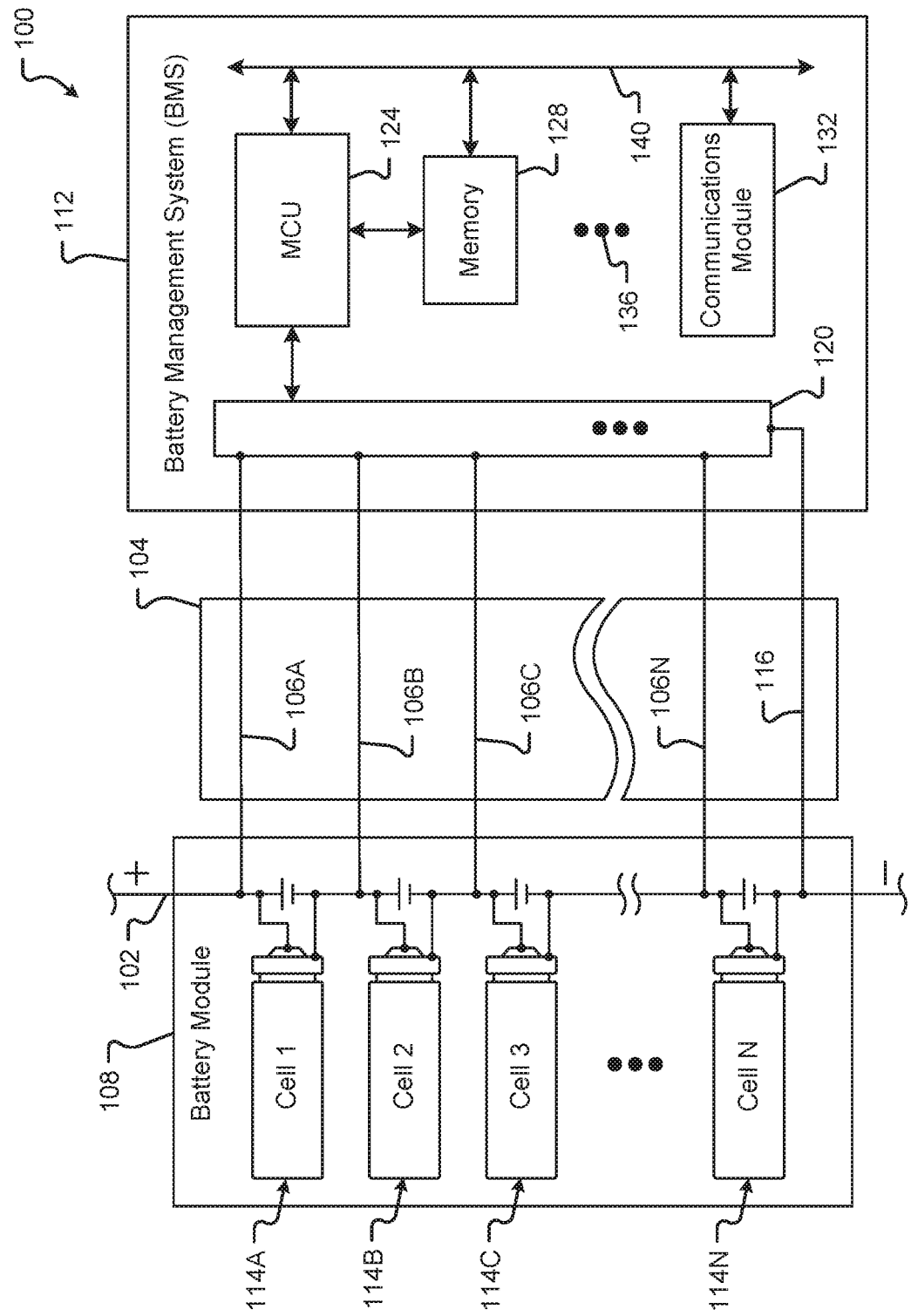
FIG. 1 is a block diagram of an illustrative battery module voltage sensing system in accordance with embodiments of the present disclosure.

Embodiments of the present disclosure will be described in connection with battery module connectors, and in some embodiments an electrical interconnect device disposed between a battery management system and a number of battery cells in an electric vehicle energy storage system.

Battery cells may be connected to one another and/or attached to a busbar of a battery system via a number of electrical interconnections. These electrical interconnections are generally made between the positive and/or negative terminals of a battery cell and respective positive and/or negative connection points on the busbar. In general, the positive terminal may be disposed on a first end of a battery cell and the negative terminal may be disposed on an opposite second end of the battery cell. In some embodiments, the negative terminal of the battery cell may be found on any conductive portion of the can, or housing, of the battery cell. This housing may be electrically separated and/or isolated from the positive terminal via at least one electrical insulating element (e.g., gasket, non-conductive material, etc.).

Typically, cylindrical battery cells include a button cap, or cover, corresponding to the positive terminal. The button cap is made from a conductive material and can include a formed portion, or protrusion, extending in an axial direction of the cylindrical battery cell away from a center of the battery cell. Among other things, this formed portion of the button cap provides a raised platform for electrical interconnection to an electrical system. In the case of some electrical vehicle battery systems, the raised platform provides a surface to which an electrical interconnection, or tab, may be attached (e.g., welded, affixed, etc.).

Modern battery cells may include a number of safety or protection features to protect against certain types of failures. These failures may include over temperatures, over pressure, and/or current surges. Many of the protection features currently used in modern battery cells need improvement. It is as aspect of the present disclosure to address various shortcomings by including replaceable and/or serviceable (including in various embodiments, fusible) elements connected to wiring of the battery management system of the battery module. The replaceable and/or serviceable (including in various embodiments, fusible) elements may be connected to the main voltage sensing lines of the battery management system of the battery module. In various aspects, the battery cells may be connected to a battery management system configured to monitor cells, including their voltage and temperature, for example. The battery management system may monitor the voltage sensed from each cell in a battery module and/or a battery pack, where monitoring the voltage of each cell is done using voltage sense lines that may also be used to balance the cells. Charging of individual cells using the sense lines may be done during manufacturing processes to make the cell voltages the same to match rest of the pack, or if it is desired to achieve active balancing in the battery pack for charge shuffle.

While conventional fusible elements may be arranged as elements, systems, or components that may be within or separate from the interconnection between the battery cells of a battery module and the battery management system (e.g., wire bonding, printed circuit board (PCB) mounted fuses, in-line fuses, etc.) the present disclosure describes embodiments where a replaceable and/or serviceable connector is included between the PCB (also called a flexible PCB and/or flexible "flex" circuit) and the battery management system. As will be appreciated, a flexible printed circuit board is an assembled electronic circuit mounted on a plastic substrate, such as a polyester (PET), polyimide (PI), polyethylene naphthalate (PEN), polyetherimide (PEI), PEEK, along with various fluropolymers (FEP) and copolymers thereof on a transparent, semi-transparent, or substantially opaque and conductive or insulative polyester thin or thick film. A bonding adhesive typically can be used to adhere the film to the circuit components. The flexible PCT can be single- or double-sided and can be flexible, semi-rigid or substantially rigid. In some embodiments, the replaceable and/or serviceable connector may include fuses that are replaceable and/or serviceable.

It is with respect to the above issues and other problems that the embodiments presented herein were contemplated. It is an aspect of the present disclosure to provide methods, devices, and systems that incorporate and support a replaceable and/or serviceable connector that is disposed between a PCB of one or more battery cells and/or battery modules and a BMS.

In various embodiments, the PCB is made for signal, or high current applications and includes surface mount components. The PCB can be used in battery cell-to-cell connections for battery applications. Problematically, the circuits in PCBs can be worn down over time at stress concentration points (including but not limited to solder joints for connectors or fuses); thus, advantageously, a replaceable and/or serviceable connector can be used to connect and service the PCB.

The PCB may be a high current (e.g., about 20 ampere) "main" flex circuit used as a cell-to-cell interconnect, which contains surface mount components for use in a battery pack (e.g., for use in automotive, low speed vehicles, aircraft, and grid storage, among other applications). The replaceable and/or serviceable connector may be a smaller and lower current (e.g., less than 2 ampere) component with surface mount fuses and a surface mount connector. The design for connecting the main flex circuit and the replaceable/serviceable component can include techniques that allow for disconnection and reconnection, including soldering techniques. In some embodiments, the connections may be soldered, de-soldered, and re-soldered using standard soldering and de-soldering techniques.

Although described in conjunction with components disposed between one or more battery cells and a battery management system, it should be appreciated that the replaceable and/or serviceable connector embodiments described herein may be used in any energy system or power circuit. The present disclosure recites battery cells and/or battery modules as an example of an energy storage device in a circuit, but the description should not be so limited. For example, the energy storage devices may include, but are in no way limited to, batteries, capacitors, ultracapacitors, supercapacitors, etc., and/or combinations thereof.

Referring to FIG. 1, a block diagram of a battery module voltage sensing system 100 (also referred to herein as a "battery module system") is shown in accordance with embodiments of the present disclosure. The battery module voltage sensing system 100 may include a printed circuit 104 electrically connecting a battery module 108 to a battery management system (BMS) 112 (also referred to herein as a slave BMS, a Cell Sense Controller (CSC), and a Cell Monitor Unit "CMU")). The printed circuit 104 may be a rigid PCB or a flexible PCB, or flex circuit. The printed circuit 104 may be a high current (20 ampere ("A")) (or "main") flex circuit that is used as a cell-to-cell interconnect, which contains components (e.g., surface mounted components) for use in a battery pack. A battery pack is useful in multiple applications, including but not limited to automotive, low speed vehicles, aircraft, and grid storage. In various embodiments, multiple CMUs (e.g., one for each battery module) may be connected together and also monitored and/or controlled via one or more BMSs.

The printed circuit 104 may include at least one substrate layer (e.g., dielectric or insulation layer) upon which a number of components such as electrical traces 106A-N, 116 may be formed. In one embodiment, the electrical traces 106A-N, 116 of the printed circuit 104 may convey electrical voltage and/or current from a source to a destination, and vice versa. The electrical traces 106A-N, 116 may be configured to provide electrical energy from one or more battery cells 114A-N in the battery module 108 to a BMS 112 or other electrical system. In one embodiment, the number of electrical traces 106A-N, 116 used by the BMS 112 to monitor a state of charge, voltage, or other electrical characteristic associated with one or more battery cells 114A-N in the battery module 108 may equal the number of battery cells 114A-N in the in the battery module 108 plus one. For instance, where the battery module 108 includes eighty battery cells 114A-N, the number of electrical traces 106A-N in the printed circuit may be at least eighty-one. This arrangement allows information from each battery cells 114A-N in the in the battery module 108 to be conveyed to the BMS 112 for monitoring and/or control.

The electrical traces 106A-N, 116 (also referred to herein as circuitry and wiring) may be arranged into a pattern that is the flex circuit 104 (pattern not shown in FIG. 1). In some embodiments, the flex circuit can incorporate fuses (not shown) corresponding to each of the cells 114A-N and/or fuses between cells 114A-N or other components of the module 108. Fuses build into the printed circuit 104 may help to protect components of the battery module system; however, due to the proximity of components (including cells 114A-N) to one another, extensive and costly module damage can occur if an event happens that is not limited to a single cell, as discussed further herein.

The electrical traces 106A-N, 116 may extend from the flex circuit 104 towards the BMS 112 to connect to the BMS 112. For example, as shown in FIG. 1, the electrical traces 106A-N, 116 extend from flex circuit 104 (e.g., as leads) to plug into a female connector of the BMS 112 (or a CMU). However, if the electrical traces 106A-N, 116 become bent or damaged, including if the leads to the BMS 112 that extend from the flex circuit 104 become bent or damaged, the traces or leads may create an electrical connection that causes a short circuit condition. Additionally, the components of the flex circuit 104, or between the flex circuit 104 and the battery module 108 or BMS 112 may become worn down over time (e.g., where the printed circuit 104 meets the connector of the BMS 112 (or CMU) and suffer a mechanical failure, which may also result in a short circuit condition. Other problems can also cause failures, such as a build-up of humidity, the use of components that are not from an original manufacturer, which can be unreliable and failure prone due to issues such as not meeting necessary design specifications. Such damage to the battery module system can damage one or more of the battery module system components and/or cause a hazardous condition. Embodiments disclosed herein provide improved solutions to these problems.

In some embodiments, the battery module 108 may comprise a number of battery cells 114A-N. The battery cells 114A-N in the battery module 108 may be connected in parallel, series, or a combination thereof. Each battery cell 114A-N may comprise a housing, a top portion, a bottom portion, and one or more terminals. As shown in FIG. 1, a first terminal may correspond to a positive terminal disposed at the top portion of the battery cell 114A-N. In some embodiments, the battery cell cap may correspond to the positive terminal of the battery cell 114A-N. In one embodiment, a second terminal may correspond to the negative terminal of the battery cell 114A-N. The second terminal may be disposed opposite the positive terminal (e.g., at the bottom portion 114A-N of the battery cell 114A-N). In one embodiment, the second terminal may be disposed on a side of the battery cell 114A-N other than the bottom portion. As provided above, the second terminal of the battery cell 114A-N may be found on any conductive portion of the can, or housing, of the battery cell 114A-N. This housing may be electrically separated and/or isolated from the positive terminal via at least one electrical insulating element (e.g., gasket, non-conductive material, etc.).

The first terminal, or battery cell cap, may be insulated from the second terminal, or other part of the battery cell 114A-N, via an insulation element. The insulation element may be configured to electrically isolate the first terminal from the second terminal, housing, or other part of the battery cell 114A-N. In some embodiments, the insulation element 116 may be made from a plastic, cardboard, paper, linen, composite, or other non-conductive material.

In one embodiment, the battery cells 114A-N may be substantially cylindrical in shape. Additionally or alternatively, the battery cells 114A-N may be symmetrical about at least one axis. For example, the battery cells 114A-N may be substantially symmetrical about a center axis running from the top portion to the bottom portion of the battery cells 114A-N. The battery cells 114A-N may include one or more manufacturing features including, but in no way limited to, indentations, alignment marks, reference datum, location features, tooling marks, orientation features, etc., and/or the like. As shown in FIG. 1, a manufacturing feature of the battery cells 114A-N may be a rolled, or sealed, portion of the battery cells 114A-N (e.g., disposed near a top portion of the battery cell 114A-N).

In some embodiments, the battery cells 114A-N may be configured to store energy via one more chemicals contained inside the housing. The battery cells 114A-N may be rechargeable and may include one or more chemical compositions, arrangements, or materials, such as, lithium-ion, lead-acid, aluminum-ion, nickel-cadmium, nickel metal hydride, nickel-iron, nickel-zinc, magnesium-ion, etc., and/or combinations thereof. The positive terminal of each battery cell 114A-N may correspond to the cathode and the negative terminal may correspond to the anode. When connected to a busbar 102, current from the battery cells 114A-N may be configured to flow from the terminals of the battery cells 114A-N through the busbar 102 to one or more components of an electric power distribution system (not shown). This current flow may provide power to one or more electrical elements associated with an electric vehicle.

The battery module 108 may be one of a number of different battery modules 108 making up a multi-module battery. In some embodiments, each battery module 108 may include a corresponding BMS 112 (or CMU). In other embodiments, the multi-module battery comprising a number of battery modules 108 may be monitored and/or controlled by a single multi-module BMS (or CMU).

The BMS 112 may include a busbar 120 including a number of terminals configured to interconnect with electrical traces 106A-N, 116 of the printed circuit 104. In some embodiments, the interconnection between the printed circuit 104 and the BMS 112 may be via a physical electrical connector disposed on the printed circuit 104, the BMS 112, and/or both the printed circuit 104 and the BMS 112. The BMS 112 may be configured to monitor and/or control a state of charge associated with each battery cell 114A-N in the battery module 108. In some embodiments, the BMS 112 may include a microcontroller unit (MCU) 124, including one or more processors, interconnected with a memory 128 via at least one connection, or communications bus 140. The memory 128 may be one or more disk drives, optical storage devices, solid-state storage devices such as a random access memory (RAM) and/or a read-only memory (ROM), which can be programmable, flash-updateable and/or the like. In any event, pairs of electrical traces 106A-N, 116 may provide voltages from the battery module 108 to the MCU 124 of the BMS 112 and these voltages may be used to determine a state (e.g., voltage, current, state of charge, etc.) associated with a particular battery cell 114A-N in the battery module 108.

Additionally or alternatively, the BMS 112 may include a communications module 132 and/or other components 136 interconnected with the communication bus 140, charger (not shown), and/or other systems in an electric power distribution system (not shown). The communications module 132 may include a modem, a network card (wireless or wired), an infra-red communication device, etc. and may permit data to be exchanged with a network and/or any other charger or processor in the electric power distribution system as described. The BMS 112 can also be referred to as a CMU and a slave BMS, and multiple slave BMSs (or BMSs/CMUs), e.g., one corresponding to each battery module 108 in a battery module system, may be connected, and may connect to a master BMS.

Examples of the processors as described herein may include, but are not limited to, at least one of Qualcomm® Snapdragon® 800 and 801, Qualcomm® Snapdragon® 620 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22 nm Haswell, Intel® Core® i5-3570K 22 nm Ivy Bridge, the AMD® FX™ family of processors, AMD® FX-4300, FX-6300, and FX-8350 32 nm Vishera, AMD® Kaveri processors, Texas Instruments® Jacinto C6000™ automotive infotainment processors, Texas Instruments® OMAP™ automotive-grade mobile processors, ARM® Cortex™-M processors, ARM® Cortex-A and ARM926EJ-S™ processors, Infineon TriCore™ processors, other industry-equivalent processors, and may perform computational functions using any known or future-developed standard, instruction set, libraries, and/or architecture.

Figure 2:
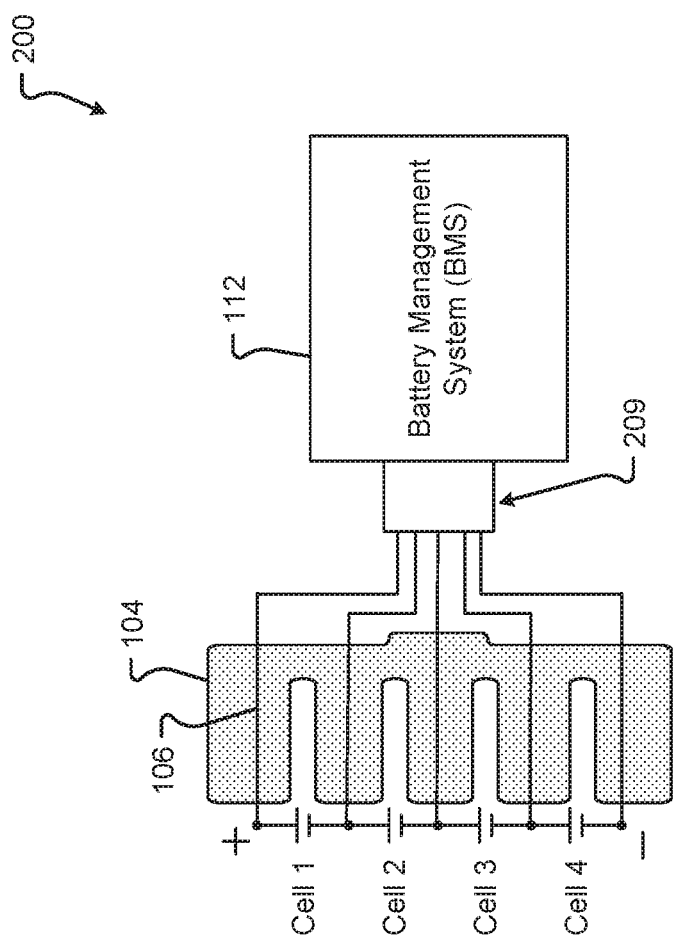
FIG. 2 is a schematic block diagram of an illustrative battery module voltage sensing system and printed circuit in accordance with embodiments of the present disclosure.

FIG. 2 is a schematic block diagram of a battery module voltage sensing system 200 including a printed circuit 104 in accordance with embodiments of the present disclosure. The voltage sensing system 200 of FIG. 2 includes a series of battery cells (e.g., Cell 1, Cell 2, Cell 3, and Cell 4) associated with a battery module 108. As illustrated in the schematic diagram of FIG. 2, the battery cells of an example battery module 108 is shown as including only four battery cells for simplicity. In FIG. 2, the electrical traces 106 extending from the printed circuit 104 extend into a connector 209 that is adjacent to the BMS 112. The connector 209 may be an interconnection device that is a replaceable connector as described herein. It may be located in any position relative to the components, including between the flex circuit and the BMS and between the flex circuit and any one or more of the slave BMSs. The connector 209 may also be connected in any manner to one or more of the module, the BMS (including slave BMSs and/or CMUs) and/or other components.

It should be appreciated, that the interconnection devices described in the present disclosure may be used with battery modules 108 including any number of battery cells (e.g., by adding electrical traces 106, etc. to the printed circuit 104, etc.) and is not only limited to four battery cells as depicted in FIG. 2. Each electrical trace 106 may be formed in a substantially planar printed circuit 104; however, the electrical traces 106 may extend in any manner from the printed circuit 104 to the connector 209. Similarly, connections (including electrical traces) may extend in any manner from the connector 209 to the BMS 112.

Figure 3A:
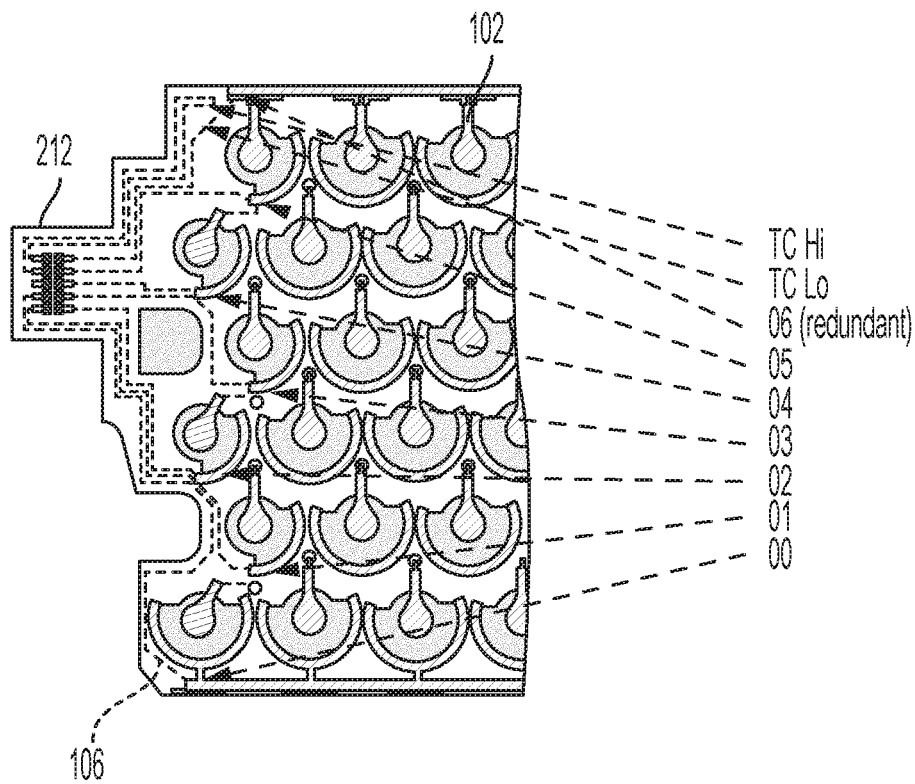
FIG. 3A is an illustrative diagram of portions of a flex circuit in accordance with embodiments of the present disclosure.

FIG. 3A is an illustrative diagram of portions of a flex circuit in accordance with embodiments of the present disclosure. In FIG. 3A, the order of the sensor lines (including voltage sense lines (also called voltage sensing wires) and temperature sense lines) is shown on the right hand side of FIG. 3A) is not important because the CMU 212 and the serviceable connector can have any configuration, and the sensor lines can include any number and order of sensor lines. For example, every voltage sense line may have a serviceable fuse irrespective of the order of sensor lines and the order can change in various embodiments. Also, the battery cells are illustratively shown as being cylindrical battery cells (e.g., with a circular end shape as shown in FIG. 3A) with a positive connection in the middle of the circular end shape and a negative connection around the rim of the end shape. Circuit wiring connects the positive and negative connections from the cells with a CMU 212 and any other wiring to convey information from the cells to the CMU 212 for monitoring and/or control.

In FIG. 3A, an illustrative CMU 212 is shown, which monitors and manages the battery module using circuit wiring 106 (only one wiring is labeled for clarity) connected to, for example, low voltage connections and high voltage connections. Fuses 102 (only one is labeled in FIG. 3A for clarity) are in electrical contact with the cells, with one fuse being provided for each cell. Other electrical components may be included in the flex circuit, including but not limited to additional fuses and a voltage monitor for each cell. The circuitry wiring 106 for the flex circuit is connected to circuitry within the CMU 212, which monitors the system via the electrical connections for variables that may include, but are not limited to, temperature, voltage, and power usage. In various embodiments, the circuit wiring 106 that extends from the cells may be integrated into a voltage sensing wire for a group of cells, and the voltage sensing wires are the leads that extend from the flex circuit to connect to the CMU 212. The CMU 212 may also perform other functions including but not limited to balancing cell usage by monitoring voltage and power usage using the circuit wiring 106 of the flex circuit.

As battery cells increase in voltage with improvements to technology, the importance of including useful fuses (e.g., fuses to protect the battery module system, appropriately placed and sized fuses, etc.) increases. However, in some cases such as the flex circuit shown in FIG. 3A, because the flex circuit connects directly to the CMU 212, the only fuses between the cells and the CMU 212 are connected within the flex circuit (e.g., fuses 102). Although only one fuse 102 per cell is shown in FIG. 3A, even when additional fuses are included for the battery module, they may be only connected to the flex circuit or within the circuit wiring 106 before it reaches the CMU 212. This may be problematic for reasons including those explained herein.

The circuit wiring 106 and fuses 102 may be made from any conductive material or combination of conductive materials, including copper, and may be a layer that is formed into a desired shape with the layer laminated between two dielectric materials. Portions of the layer may be exposed to form connections between components of the module and connections between the flex circuit and external components such as the CMU 212 (e.g., via leads that are wires extending off of an edge of the flex circuit board). Thus, the CMU 212 may have female connecting receptacles that the leads from the flex circuit are inserted within. The connectors are not limited to what is shown and discussed herein. The connectors may have other configurations, such as extending from the CMU with female connection receptacles on the flex circuit side.

Various designs of the flex circuit and circuit wiring (including those that have fuses incorporated into the flex circuit and/or with circuit wiring 106 connecting the flex circuit to the CMU 212) are problematic for multiple reasons because such designs can increase the likelihood of errors in the battery module system. For example, if the flex circuit to CMU connections are leads that extend to be inserted into female receptacles, then there is a chance of making a wrong connection (e.g., inserting a lead into a wrong receptacle or misplacing a connecting lead due to an offset receptacle or wiring, a bent wire, etc.) or making an error in assembly so that a short circuit occurs. If a short circuit occurs, undesirable and/or dangerous conditions may result including but not limited to irreversibly damaging components, shorting one or more components, a high-temperature event that may result in a fire, etc. These problems can not only be dangerous due to a fire issue, they can also be costly due to loss of components including the possibility of irreversibly damaging or destroying an entire battery module. Thus, methods and systems for improved use of connectors and fuses, as described in various embodiments disclosed herein, are desirable.

Figure 3B:
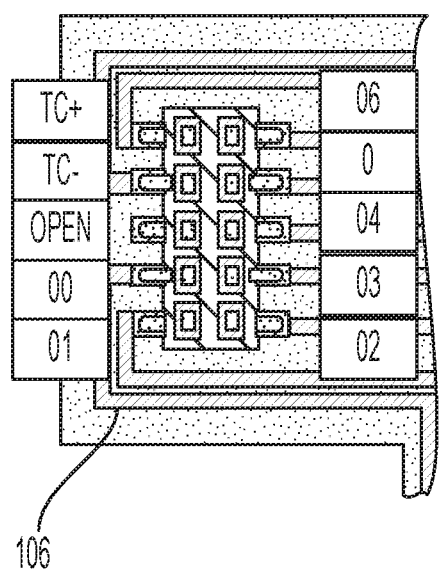
FIG. 3B is an illustrative schematic of flex circuit connector pinouts in accordance with embodiments of the present disclosure.

FIG. 3B is an illustrative schematic of flex circuit connector pinouts in accordance with embodiments of the present disclosure. The flex circuit connector pinouts may correspond to the CMU 212 shown in FIG. 3A. The pinout connections in FIG. 3B are labeled according to their respective connections. The pinout connections may maintain a same configuration when used with interconnection devices (also referred to herein as replaceable connectors and serviceable connectors) as disclosed in various embodiments described herein.

Figure 4:
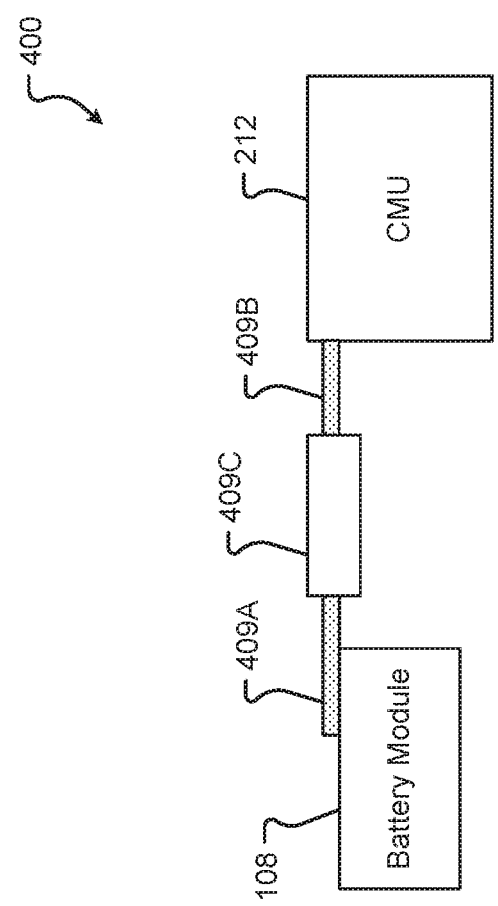
FIG. 4 is a block diagram of an illustrative serviceable connector in accordance with embodiments of the present disclosure.

FIG. 4 is a block diagram of a serviceable connector in accordance with embodiments of the present disclosure. In particular, FIG. 4 shows a first connection portion 409A and a second connection portion 409B of a serviceable connector 409C. The first connection portion 409A may include the leads from a flex circuit (not shown in FIG. 4) that extend from a battery module 108 to the serviceable connector 409C. Similarly, the second connection portion 409B may include the leads from the BMS 112 that extend from the BMS 112 to the serviceable connector 409C. In various embodiments, the leads extending to and/or from the serviceable connector 409C are structurally supported. The leads may be incorporated into a substrate (e.g., laminated between materials) that is the first connection portion 409A and second connection portion 409B, where the first connection portion 409A and second connection portion 409B structurally and electrically connect at the serviceable connector 409C, as explained further in FIGS. 5A, 5B, and 6.

The first connection portion 409A may have any configuration that allows the printed circuit to extend from the battery module 108 to the serviceable connector 409C, and the second connection portion 409B may have any configuration that allows circuitry of the CMU 212 to extend to the serviceable connector 409C. The first connection portion 409A (including the portion of it within the serviceable connector 409C as explained in FIGS. 5A and 6) may also be referred to herein as the main circuit side of the serviceable connector 409C. The second connection portion 409B (including the portion of it within the serviceable connector 409C as explained in FIGS. 5B and 6) may also be referred to herein as the replaceable circuit side of the serviceable connector 409C. The serviceable connector 409C contains, for example, serviceable connectors, wiring, and fuses. The serviceable connector 409C, or portions thereof, may be serviceable and/or replaceable.

Figure 5A:
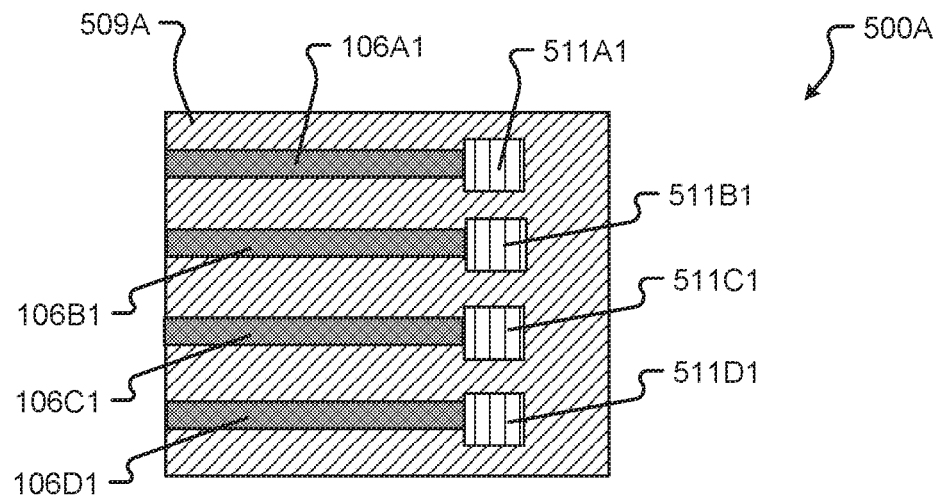
FIG. 5A is a block diagram of an illustrative main circuit side of a serviceable connector in accordance with embodiments of the present disclosure.

FIG. 5A is a block diagram of a main circuit side of a serviceable connector in accordance with embodiments of the present disclosure. In various embodiments, the serviceable connector 500A corresponds to at least a portion of the first connection portion 409A and a portion of the serviceable connector 409C as shown in FIG. 4.

Leads 106A1-D1 (also referred to as circuitry wiring) extend from a flex circuit (not shown in FIG. 5A) (e.g., printed circuit 104) to solder pads 511A1-D1, with each lead connecting to a corresponding solder pad. The leads 106A1-D1 and solder pads 511A1-D1 may be supported by, including partially or fully contained within, a substrate. For example, the leads 106A1-D1 may be entirely enclosed within a substrate and electrically connected within the substrate to the solder pads 511A1-D1, which are exposed on one surface of the substrate to create an electrical connection (as explained in FIG. 6).

The leads 106A1-D1 and solder pads 511A1-D1 may be one or more layers that are laminated between two materials. Although one configuration is shown in FIG. 5A, the components of the main circuit side of a serviceable connector may be arranged in any manner to electrically connect circuitry wiring of a flex circuit to solder pads. The leads 106A1-D1 and/or solder pads 511A1-D1, or portions thereof, may be made from any conductive material or combination of conductive materials, including copper.

Figure 5B:
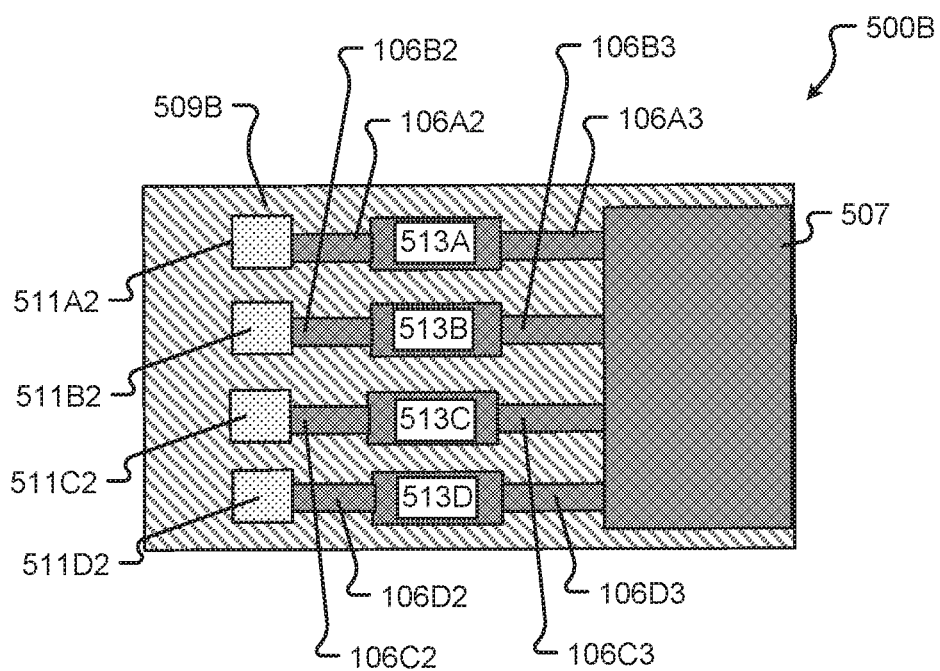
FIG. 5B is a block diagram of an illustrative replaceable circuit side of a serviceable connector in accordance with embodiments of the present disclosure.

FIG. 5B is a block diagram of a replaceable circuit side of a serviceable connector in accordance with embodiments of the present disclosure. In various embodiments, the serviceable connector 500B corresponds to at least a portion of the second connection portion 409B and a portion of the serviceable connector 409C as shown in FIG. 4.

A connector 507 electrically connects the replaceable circuit side to other circuitry, such as a control unit. For example, the connector 507 electrically connects wiring (e.g., leads 106A3-D3) to a connecting and/or control unit (e.g., CMU 212). The connector may connect electrical traces (not shown) that extend from the connector 507 (e.g., as leads) to plug into a female connector of a control unit (e.g., a BMS 112 or a CMU 212).

Leads 106A3-D3 (also referred to as circuitry wiring) extend from the connector 507 to fuses 513A-D, with each lead connecting to a corresponding fuse, and from fuses 513A-D to solder pads 511A2-D2, with each lead connecting to a corresponding solder pad. The connector 507, leads 106A2-D2 and 106A3-D3, fuses 513A-D, and solder pads 511A2-D2 may be supported by, including partially or fully contained within, a substrate. For example, leads 106A2-D2 and 106A3-D3 may be entirely enclosed within a substrate and electrically connected within the substrate to the solder pads 511A2-D2, which are exposed to create an electrical connection (as explained in FIG. 6) on one surface of the substrate. The connector 507 may be almost fully enclosed within the substrate except for portions of the connector 507 that are exposed to connect (electrically and/or otherwise) the connector 507 to a control unit (e.g., CMU 212).

The leads 106A2-D2 and 106A3-D3, fuses 513A-D, and solder pads 511A2-D2 may be one or more layers that are laminated between two materials. Although one configuration is shown in FIG. 5B, the components of the replaceable circuit side of a serviceable connector may be arranged in any manner to electrically connect circuitry wiring of a control unit to solder pads. The connector 507, leads 106A2-D2 and 106A3-D3, fuses 513A-D, and/or solder pads 511A2-D2, or portions thereof, may be made from any conductive material or combination of conductive materials, including copper.

Figure 6:
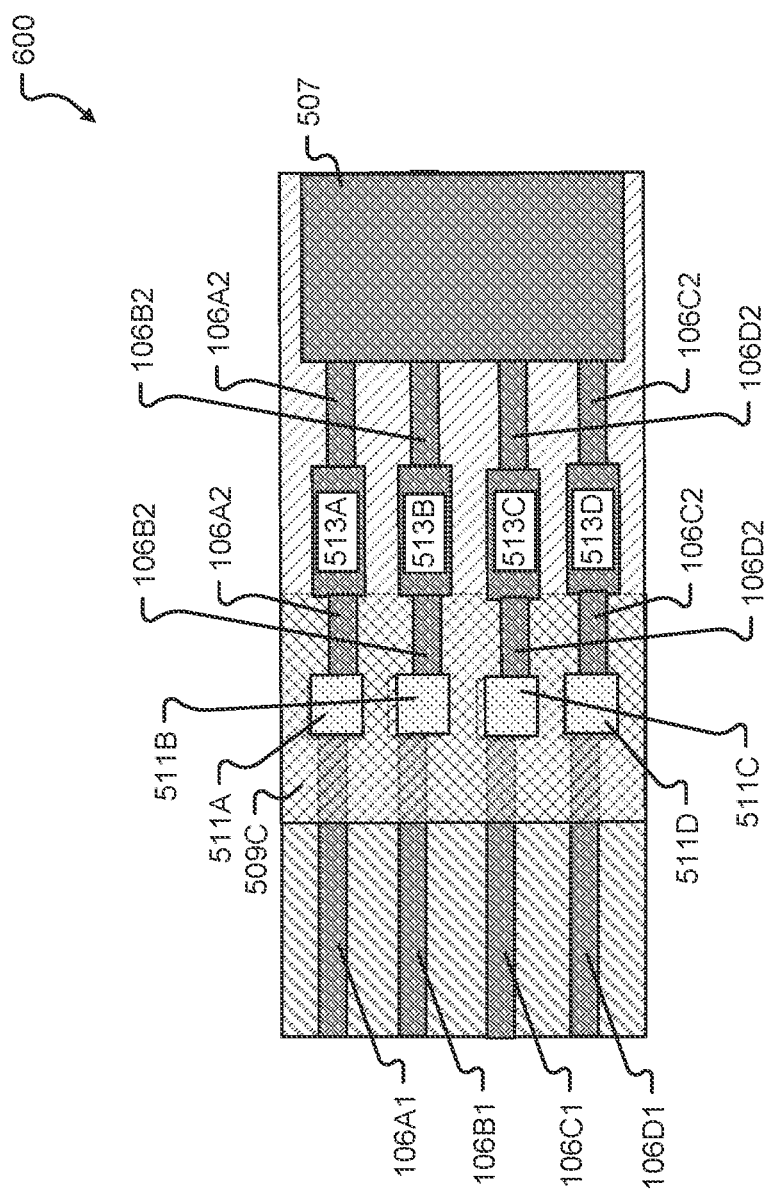
FIG. 6 is a block diagram of an illustrative connected serviceable connector in accordance with embodiments of the present disclosure.

FIG. 6 is a block diagram of a connected serviceable connector in accordance with embodiments of the present disclosure. Components of FIG. 6 may correspond to those shown and described in FIGS. 5A and 5B. In various embodiments, the overlap portion 509C corresponds to the serviceable connector 409C shown in FIG. 4.

In FIG. 6, the solder pads from each of the main circuit side and the replaceable circuit side are aligned (e.g., by overlapping a portion of the main circuit side with the replaceable circuit side to overlap the solder pads located on each of the main circuit side and the replaceable circuit side in a plan view direction). In various embodiments, the solder pads are exposed on one surface side of the substrate for the main circuit side and on the opposite surface side of the substrate for the replaceable circuit side so that the solder pads may be in physical contact when aligned, or in physical contact when a solder material is applied between the aligned pads to solder the pads and connect them electrically.

The solder pads may be connected (e.g., soldered) together to form an electrical connection. For example, solder pads 511A-D are connected by aligning and then soldering 511A1 to 511A2, 511B1 to 511B2, 511C1 to 511C2, and 511D1 to 511D2. The means of connecting the leads (e.g., the solder pads shown in FIGS. 5A, 5B, and 6) are not limited by the description herein, and other means of connecting the leads may be used, such as components that may be crimped together to provide an electrical connection between leads. Some means of connecting the leads may be reversible (able to be disconnected one or multiple times and reconnected one or multiple times). If the design of electrically connecting the leads is reversible (e.g., via soldering, de-soldering, and re-soldering, etc.) this can provide further advantages such as cost savings in the event rework is needed.

When the solder pads are connected to form solder pads 511A-D, leads 106A1-D1 are electrically connected to leads 106A2-D2 and 106A3-D3 through fuses 513A-D, as shown in FIG. 6. In some embodiments, the leads correspond to voltage sensing wires with each lead being a wire connecting a different group of cells within the battery module, and there is one fuse (e.g., one of 513A-D) connected to each voltage sensing wire. Electrically connecting various leads through fuses in a serviceable connector is advantageous for multiple reasons. For example, if the fuses 511A-D in the serviceable connector are not present, then any wiring or connection error between the flex circuit and the CMU will result in an uncontrolled short (e.g., the short may damage some or all of the flex circuit and other components). However, when fuses 511A-D are present in the serviceable connector, then any errors in the wiring or connection between the flex circuit and the CMU will result in one or more of fuses 511A-D being blown. Advantageously, the fuses 511A-D may be easily and quickly fixed at a lower cost than damage that could occur to the flex circuit or other components if fuses 511A-D were not present. This is because, for example, the solder pads 511A-D can be reversibly connected (e.g., they may be de-soldered) to disconnect the main circuit side from the replaceable circuit side for maintenance, repairs, etc. It may be advantageous to have the fuses 511A-D located closer to the cell side of the flex circuit (e.g., from the side connecting to a battery module 108) than the connector 507 side of the flex circuit. Also, the fuses 513A-D may be more easily and quickly repaired than other components, such as the flex circuit. Such advantages can result in significant cost savings.

Other advantages can be achieved by the embodiments disclosed herein. Other advantages include but are not limited to being able to standardize components of the battery module system; for example, being able to connect a standardized flex circuit to different designs of CMUs. In particular, a serviceable connector (e.g., the replaceable circuit side) could be redesigned and/or swapped out to accommodate different designs of CMUs while using a standardized flex circuit. One or more components of the serviceable connector could be redesigned and/or swapped out while maintaining the design of the other components. Thus, by way of example, a replaceable circuit side could have multiple different designs to accommodate changes in design to CMUs while maintaining the design of the main circuit side that is connected to the flex circuit. Further, such ease of modification would enable an improved ability to change connector configurations and to update or change fuses including fuse sizing. The ability to change fuse configuration and/or sizing (e.g., amperage of the fuses) is advantages if a different type or design of CMU is connected. If the design of the CMU changes, then the replaceable circuit side could be redesigned without having to change the main circuit side and flexible circuit. Also, if a vehicle with different charging requirements were used with the flex circuit, or if the charging requirements of the vehicle changed, then the fuses could be made smaller or larger (e.g., for a vehicle with slower charging requirements that requires less balancing and more voltage sensing or for a vehicle with faster charging requirements that requires more balancing and less voltage sensing, respectively). Thus, the fuse design may advantageously be adjusted and/or determined based on differing balancing requirements (e.g., Simple balance/Rapid Balance) where the balancing is done using the voltage sense lines. Still further, fuses in a serviceable connector may advantageously have a smaller amperage than some or all fuses in the flexible circuit. In addition, the lengths of each fuse can be set so that, upon the fuse blowing, the length of the fuse prevents any arcing for the designed current load of the fuse.

Advantages of the present disclosure may outweigh any potential disadvantages, including an increase in the number of parts and a possible slight increase in a space required to accommodate the serviceable connector. In various embodiments, the size of the serviceable connector may not substantially increase from size requirements of previous designs. For example, the size may need to be increased slightly to accommodate for slightly longer wiring that incorporates the fuses; however, the soldering pads may not cause any increase in the design due to their size and accessibility requirements.

The exemplary systems and methods of this disclosure have been described in relation to electrical connections and electrical interconnect devices disposed between a battery management system and a number of battery cells in an electric vehicle energy storage system. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

Any of the steps, functions, and operations discussed herein can be performed continuously and automatically.

The exemplary systems and methods of this disclosure have been described in relation to vehicle systems and electric vehicles. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

Furthermore, while the exemplary embodiments illustrated herein show the various components of the system collocated, certain components of the system can be located remotely, at distant portions of a distributed network, such as a LAN and/or the Internet, or within a dedicated system. Thus, it should be appreciated, that the components of the system can be combined into one or more devices, such as a server, communication device, or collocated on a particular node of a distributed network, such as an analog and/or digital telecommunications network, a packet-switched network, or a circuit-switched network. It will be appreciated from the preceding description, and for reasons of computational efficiency, that the components of the system can be arranged at any location within a distributed network of components without affecting the operation of the system.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire, and fiber optics, and may take the form of acoustic or light waves, such as those generated during radio-wave and infra-red data communications.

While the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s)

or means capable of implementing the methodology illustrated herein can be used to implement the various aspects of this disclosure. Exemplary hardware that can be used for the present disclosure includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as a program embedded on a personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the embodiments with reference to particular standards and protocols, the disclosure is not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Embodiments include a battery connector, comprising: a flexible circuit comprising a first set of electrical circuitry connecting to a plurality of energy storage cells, wherein the first set of electrical circuitry terminates at a first connection point at the battery connector; a controller comprising components to control the energy storage cells connected to a second set of electrical circuitry terminating at a second connection point at the battery connector; wherein the first connection point and the second connection point are electrically connected.

Aspects of the battery connector include wherein prior to terminating in the second connection point, the electrical circuitry is connected through at least one fuse adjacent to the second connection point and within the battery connector. Aspects of the battery connector include wherein the electrical connection of the first connection point and the second connection point is a soldered connection, wherein the electrical circuitry is etched from a conductive metal foil, wherein the etched metal foil is supported by a polymeric substrate, and wherein the etched metal foil is adhered to the polymeric substrate by an adhesive. Aspects of the battery connector include wherein the first connection point is a first plurality of connection points and the second connection point is a second plurality of connection points and every one of the first connection points in the first plurality of connection points is soldered to a single corresponding one of the second connection points in the second plurality of connection points. Aspects of the battery connector include wherein the first connection point is a first plurality of connection points, wherein the second connection point is a second plurality of connection points, wherein each of the connection points in the second plurality of connection points is connected through a fuse, and wherein every one of the first connection points in the first plurality of connection points is electrically connected to a single corresponding one of the second connection points in the second plurality of connection points. Aspects of the battery connector include wherein the at least one fuse is an amperage that is lower than an amperage of fuses of electrical components of the flexible circuit. Aspects of the battery connector include wherein the first set of electrical circuitry that terminates at the first connection point is voltage sensing wires of the flexible circuit. Aspects of the battery connector include wherein the second set of electrical circuitry has a first configuration that is different from a second configuration, and wherein the second connection point is standardized so that the first configuration and the second configuration connect to a same design of the second connection point. Aspects of the battery connector include wherein each of the at least one fuses is about two amperes. Aspects of the battery connector include wherein the at least one fuse is reparable or replaceable by accessing the at least one fuse through the battery connector.

Embodiments include a method of using a battery connector, comprising: positioning a flexible circuit comprising a first set of electrical circuitry in contact with a plurality of energy storage cells, wherein the first set of electrical circuitry terminates at a first connection point at the battery connector; positioning a second connection point at the battery connector, wherein the second connection point terminates a second set of electrical circuitry from a controller comprising components to control the energy storage cells; and electrically connecting the first connection point to the second connection point.

Aspects of the method of using a battery connector include wherein prior to terminating in the first connection point, the electrical circuitry is connected through at least one fuse adjacent to the first connection point. Aspects of the method of using a battery connector include wherein the electrically connecting is soldering, wherein the electrical circuitry is etched from a conductive metal foil, wherein the etched metal foil is supported by a polymeric substrate, and wherein the etched metal foil is adhered to the polymeric substrate by an adhesive. Aspects of the method of using a battery connector include wherein the first connection point is a first plurality of connection points and the second connection point is a second plurality of connection points and every one of the first connection points in the first plurality of connection points is soldered to a single corresponding one of the second connection points in the second plurality of connection points. Aspects of the method of using a battery connector include wherein the first connection point is a first plurality of connection points, wherein the second connection point is a second plurality of connection points, wherein each of the connection points in the first plurality of connection points is connected through a fuse, and wherein every one of the first connection points in the first plurality of connection points is electrically connected to a single corresponding one of the second connection points in the second plurality of connection points. Aspects of the method of using a battery connector include wherein the at least one fuse is an amperage that is lower than an amperage of fuses of electrical components of the flexible circuit. Aspects of the method of using a battery connector include wherein the first set of electrical circuitry that terminates at the first connection point is voltage sensing wires of the flexible circuit. Aspects of the method of using a battery connector include wherein the second set of electrical circuitry has a first configuration that is different from a second configuration, and wherein the second connection point is standardized so that the first configuration and the second configuration have a same design of the second connection point. Aspects of the method of using a battery connector include wherein each of the at least one fuses is about two amperes.

Embodiments include an electrical connector, comprising: a set of solder points connecting a first set of wiring and a second set of wiring, wherein each wire in the first set of wiring is connected to a corresponding wire of a flexible circuit, wherein the flexible circuit is connected to a plurality of energy storage cells; and wherein each wire in the second set a wiring is electrically connected through a corresponding fuse to a controller comprising components to control the energy storage cells.

Any one or more of the aspects/embodiments as substantially disclosed herein.

Any one or more of the aspects/embodiments as substantially disclosed herein optionally in combination with any one or more other aspects/embodiments as substantially disclosed herein.

One or more means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

The term "electric vehicle" (EV), also referred to herein as an electric drive vehicle, may use one or more electric motors or traction motors for propulsion. An electric vehicle may be powered through a collector system by electricity from off-vehicle sources, or may be self-contained with a battery or generator to convert fuel to electricity. An electric vehicle generally includes a rechargeable electricity storage system (RESS) (also called Full Electric Vehicles (FEV)). Power storage methods may include: chemical energy stored on the vehicle in on-board batteries (e.g., battery electric vehicle or BEV), on board kinetic energy storage (e.g., flywheels), and/or static energy (e.g., by on-board double-layer capacitors). Batteries, electric double-layer capacitors, and flywheel energy storage may be forms of rechargeable on-board electrical storage.

The term "hybrid electric vehicle" refers to a vehicle that may combine a conventional (usually fossil fuel-powered) powertrain with some form of electric propulsion. Most hybrid electric vehicles combine a conventional internal combustion engine (ICE) propulsion system with an electric propulsion system (hybrid vehicle drivetrain). In parallel hybrids, the ICE and the electric motor are both connected to the mechanical transmission and can simultaneously transmit power to drive the wheels, usually through a conventional transmission. In series hybrids, only the electric motor drives the drivetrain, and a smaller ICE works as a generator to power the electric motor or to recharge the batteries. Power-split hybrids combine series and parallel characteristics. A full hybrid, sometimes also called a strong hybrid, is a vehicle that can run on just the engine, just the batteries, or a combination of both. A mid hybrid is a vehicle that cannot be driven solely on its electric motor, because the electric motor does not have enough power to propel the vehicle on its own.

The term "rechargeable electric vehicle" or "REV" refers to a vehicle with on board rechargeable energy storage, including electric vehicles and hybrid electric vehicles.

What is claimed is:

1. A battery connector, comprising:
a flexible circuit board comprising a first set of wirings connected to a plurality of energy storage cells, wherein the first set of wirings terminates at a first connection point on the flexible circuit board; and
a replaceable circuit board comprising:
a connector that connects to a controller that controls the plurality of energy storage cells; and
a second set of wirings electrically connected to the connector and terminating at a second connection point on the replaceable circuit board;
wherein the first connection point on the flexible circuit board and the second connection point on the replaceable circuit board overlap one another and are electrically connected to each other,
wherein the replaceable circuit board further comprises at least one fuse electrically connected between the connector and the second connection point,
wherein the first connection point comprises a first solder pad and the second connection point comprises a second solder pad, and wherein the first solder pad and the second solder pad are electrically connected through a soldered connection,
wherein the second set of wirings is etched from a conductive foil, wherein the board, and wherein the etched conductive foil is adhered to the polymeric substrate by an adhesive.

2. The battery connector of claim 1, wherein the first connection point includes a first plurality of solder pads including the first solder pad and the second connection point includes a second plurality of solder pads including the second solder pad, and wherein each solder pad in the first plurality of solder pads is soldered to a respective solder pad in the second plurality of solder pads.

3. The battery connector of claim 1, wherein the first connection point includes a first plurality of solder pads, including the first solder pad, wherein the second connection point includes a second plurality of solder pads including the second solder pad, wherein each solder pad in the second plurality of solder pads is connected to the connector through a fuse of the at least one fuse, and wherein each solder pad in the first plurality of solder pads is electrically connected to a respective solder pad in the second plurality of solder pads.

4. The battery connector of claim 1, wherein the at least one fuse is rated with an amperage that is lower than an amperage rating of the flexible circuit board.

5. The battery connector of claim 1, wherein the first set of wirings comprises voltage sensing wires of the flexible circuit board.

6. The battery connector of claim 4, wherein the flexible circuit board is rated for 20 amperes.

7. The battery connector of claim 6, wherein each fuse in the at least one fuse is rated for about two amperes.

8. The battery connector of claim 1, wherein the at least one fuse is reparable or replaceable by accessing the at least one fuse on the replaceable circuit board.

9. A method, comprising:
providing a flexible circuit board comprising a first set of wirings in electrical contact with a plurality of energy storage cells, wherein the first set of wirings terminates at a first connection point on the flexible circuit board;
positioning a replaceable circuit board comprising a second set of wirings that terminate at a second connection point on the replaceable circuit board in an overlapping relationship with the flexible circuit board, wherein the second set of wirings is electrically connected to a connector that connects to a controller that controls the plurality of energy storage cells; and electrically connecting the first connection point to the second connection point while the flexible circuit board and the replaceable circuit board are in the overlapping relationship, wherein at least one fuse is electrically connected between the second set of wirings and the connector, wherein the electrically connecting includes soldering the first connection point to the second connection point, wherein the second set of wirings is etched from a conductive foil, wherein the etched conductive foil is supported by a polymeric substrate of the replaceable circuit board and wherein the etched conductive foil is adhered to the polymeric substrate by an adhesive.

10. The method of claim 9, wherein the first connection point includes a first plurality of solder pads and the second connection point includes a second plurality of solder pads, and wherein each solder pad in the first plurality of solder pads is soldered to a respective solder pad in the second plurality of solder pads.

11. The method of claim 9, wherein the first connection point includes a first plurality of solder pads, wherein the second connection point includes a second plurality of solder pads, wherein each solder pad in the second plurality of solder pads is connected to the connector through a fuse of the at least one fuse, and wherein each solder pad in the first plurality of solder pads is electrically connected to a respective solder pad in the second plurality of solder pads.

12. The method of claim 9, wherein the at least one fuse is rated with an amperage that is lower than an amperage rating of the flexible circuit board.

13. The method of claim 9, wherein the first set of wirings comprises voltage sensing wires of the flexible circuit board.

14. The method of claim 12, wherein the flexible circuit board is rated for 20 amperes.

15. The method of claim 14, wherein each fuse in the at least one fuse is rated for about two amperes.

16. A replaceable electrical connector, comprising:
a first printed circuit board (PCB);
a connector mounted on the first PCB and that connects to a controller that controls energy storage cells of a vehicle;
a first set of solder pads on the first PCB;
a first set of wirings on the first PCB and electrically connected between the first set of solder pads and the connector; and
a set of fuses on the first PCB, each fuse being electrically connected between a respective wiring in the first set of wirings and a respective solder pad in the first set of solder pads, wherein the first set of solder pads are soldered to a second set of solder pads of a second PCB comprising a second set of wirings that are electrically connected to the second set of solder pads and the energy storage cells.

* * * * *